US011239265B2

(12) United States Patent
Van Sieleghem

(10) Patent No.: US 11,239,265 B2
(45) Date of Patent: Feb. 1, 2022

(54) SINGLE-PHOTON AVALANCHE DIODE DETECTOR ARRAY

(71) Applicants: IMEC VZW, Leuven (BE); Katholieke Universiteit Leuven, KU LEUVEN R & D, Leuven (BE)

(72) Inventor: Edward Van Sieleghem, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 16/911,785

(22) Filed: Jun. 25, 2020

(65) Prior Publication Data
US 2021/0005645 A1 Jan. 7, 2021

(30) Foreign Application Priority Data
Jul. 1, 2019 (EP) .................................. 19183610

(51) Int. Cl.
*H01L 27/144* (2006.01)
*H01L 31/107* (2006.01)
(52) U.S. Cl.
CPC ...... *H01L 27/1446* (2013.01); *H01L 27/1443* (2013.01); *H01L 31/107* (2013.01)
(58) Field of Classification Search
None
See application file for complete search history.

(56) References Cited
U.S. PATENT DOCUMENTS

2010/0148040 A1* 6/2010 Sanfilippo ........... H01L 31/1075
250/214.1
2011/0241149 A1* 10/2011 Mazzillo ............... H01L 31/107
257/438

(Continued)

FOREIGN PATENT DOCUMENTS
WO 2005048319 A2 5/2005

OTHER PUBLICATIONS

European Search Report, EP Application No. 19183610.5, dated Feb. 6, 2020, 7 pages.

(Continued)

*Primary Examiner* — Andres Munoz
(74) *Attorney, Agent, or Firm* — McDonnell Boehnen Hulbert & Berghoff LLP

(57) ABSTRACT

Example embodiments relate to single-photon avalanche diode detector (SPAD) arrays. One embodiment includes a SPAD array that includes a silicon substrate, a plurality of primary electrodes, and a plurality of secondary electrodes. Each of the primary electrodes includes a semiconductor material of a first doping type, extends in the silicon substrate in a first direction, and has a rotationally symmetric cross-section in a first plane perpendicular to the first direction. The plurality of secondary electrodes includes a semiconductor material of a second doping type and extends parallel to the primary electrodes in the silicon substrate. Further, the silicon substrate includes a doped upper field redistribution layer, a doped lower field redistribution layer, and a doped depletion layer arranged between the upper field redistribution layer and the lower field redistribution layer. A cross-section of each primary electrode is surrounding by one or more cross-sections of at least one neighboring secondary electrode.

15 Claims, 3 Drawing Sheets

(56) References Cited

U.S. PATENT DOCUMENTS

2011/0272561 A1* 11/2011 Sanfilippo ............ H01L 31/107
250/214.1
2019/0051772 A1    2/2019  Teva et al.
2019/0198701 A1    6/2019  Moussy

OTHER PUBLICATIONS

Loi, Angelo. "Design of 3D Silicon Sensors for High Resolution Time Measurements". On behalf of TIMESPOT project, 31 pages. Feb. 19, 2018.
Moll, Michael. "The RD50 Collaboration—Radiation tolerant silicon detectors". CERN Accelerating Science, EP Newsletter of the EP department, 5 pages. Jun. 3, 2013.
Da Vià, Cinzia "3D sensors and micro-fabricated detector systems" Nuclear Instruments and Methods in Physics Research Section A: Accelerators, Spectrometers, Detectors and Associated Equipment 765 (2014): pp. 151-154.
Loi, Angelo "IOP: 3D detectors with high space and time resolution" In J. Phys.: Conf. Ser., vol. 956, p. 012012 6 pages. 2018.
Kenney, Christopher J., Sherwood I. Parker, and Julie Segal. "3D-A New Architecture for Solid-state Radiation Detectors." APS (1996): 21 pages.
Krzywda, A., E. Alagoz, M. Bubna, M. Obertino, A. Solano, K. Arndt, L. Uplegger et al. "Pre-and post-irradiation performance of FBK 3D silicon pixel detectors for CMS." Nuclear Instruments and Methods in Physics Research Section A: Accelerators, Spectrometers, Detectors and Associated Equipment 763 (2014): 14 pages.

* cited by examiner

SINGLE-PHOTON AVALANCHE DIODE DETECTOR ARRAY

CROSS-REFERENCE TO RELATED APPLICATIONS

The present application is a non-provisional patent application claiming priority to European Patent Application No. EP 19183610.5, filed Jul. 1, 2019, the contents of which are hereby incorporated by reference.

FIELD OF THE DISCLOSURE

The present disclosure generally relates to the field of light detection. More in particular, the present disclosure relates to light detection using an array of single-photon avalanche diodes.

BACKGROUND

A commonly-used technique for single-photon detection is based on solid-state avalanche photodiodes. Such devices may be operated in the so-called Geiger mode, meaning that individual photo-generated charges are multiplied into detectable charge packets through impact ionization in an electric field. When operating in this mode, the detector may be referred to as a single-photon avalanche diode (SPAD). For many applications, including for example range-finding, detecting near-infrared (NIR) radiation with high efficiency using such SPAD detectors may be important.

To exploit well-established semiconductor processing platforms, and to simplify on-chip integration of CMOS circuitry, there may be a strong interest in developing and fabricating arrays of such SPADs in silicon. However, due to the low energy (~1 eV) of NIR radiation, silicon provides a small absorption coefficient for such radiation. Therefore, a depleted volume may be used in addition to an electric field. This may introduce trade-offs between detection speed, noise, uniformity, and sensitivity. Implementing arrays of SPADs in silicon may thus be challenging.

SUMMARY

The present disclosure provides a way of overcoming the above challenge. To at least partly achieve this goal, the present disclosure provides a single-photon avalanche diode (SPAD) array as defined in the independent claim. Further embodiments of the SPAD array are provided in the dependent claims.

According to one aspect of the present disclosure, the SPAD array includes a silicon substrate. The SPAD array includes a plurality of primary electrodes. Each primary electrode includes a semiconductor material of a first doping type. Each primary electrode extends in the silicon substrate in a first direction. Each primary electrode has a rotationally symmetric cross-section in a first plane perpendicular to the first direction. The SPAD array also includes a plurality of secondary electrodes. Each secondary electrode includes a semiconductor material of a second doping type. Each secondary electrode extends parallel to the primary electrodes in the silicon substrate. The silicon substrate further includes a doped upper field redistribution layer, a doped lower field redistribution layer, and a doped depletion layer arranged between the upper field redistribution layer and the lower field redistribution layer. The primary electrodes extend from the upper field redistribution layer, through the depletion layer and into the lower field redistribution layer of the silicon substrate. The cross-section of each primary electrode may be approximately uniform in the depletion layer. The secondary electrodes extend from the upper field redistribution layer and at least into the depletion layer. The primary electrodes and the secondary electrodes are further configured such that the cross-section of each primary electrode is surrounded, in the first plane, by one or more cross-sections of at least one neighboring secondary electrode. The primary electrodes, the secondary electrodes, and doping concentrations of the various device layers (e.g. the upper field redistribution layer, the lower field redistribution layer, and the depletion layer) are further configured such that, if a sufficiently high reverse potential is applied between each primary electrode and the at least one neighboring secondary electrode: a) a resulting electric field near each primary electrode is radially uniform and peaked such that impact ionization (and e.g. charge multiplication) can occur close thereto, and such that a cross-section of the resulting electric field is uniform throughout a majority of the depletion layer; b) a remaining bulk silicon volume between each primary electrode and the at least one neighboring secondary electrode is depleted (e.g. fully depleted, or at least highly depleted, such as in e.g. equal 80% or more of the volume between the neighboring primary and secondary electrodes); c) the resulting electric field at the upper field redistribution layer and the lower field redistribution layer is not peaked, such that impact ionization can be locally suppressed; and d) the primary electrodes are electrically isolated due to one or more potential barriers formed by (e.g. below and/or between) the plurality of secondary electrodes (e.g. by the secondary electrodes extending deep enough to create such one or more potential barriers for the primary electrodes during operating conditions).

The extension of the substrate and various electrodes into the third dimension may allow to obtain a large photon absorption probability while maintaining fast transport of photo-generated carriers to a nearest device electrode. The electric field present near the primary electrode(s) also provides a region in which the photo-generated carriers may multiply into detectable charge packets. This may be achieved without using an intrinsic substrate or additional doped regions in proximity of the electrodes, both of which may cause detrimental effects to the performance and uniformity of the SPAD array. Consequently, the SPAD array of the present disclosure makes possible to resolve the absorption of a single NIR photon in silicon, due to an internal gain process (avalanche multiplication). This should be contrasted with e.g. detectors used for detection of high-energy radiation such as X-rays or gamma rays (wherein the relevant energy is in the order of MeV). Such devices may instead rely on the high-energy radiation and its ionizing nature in silicon to create electron-hole pairs, and the ability to thereby generate multiple charges from a single high-energy particle. Consequently, such high-energy detectors typically do not implement any internal gain process in order to amplify a generated carrier. In fact, in high-energy detectors, active measures may be used to prevent such a gain process, for example by creating a more uniform electric field between the electrodes without any peaks close to a primary electrode (i.e. without the field peaks provided by the geometry, doping, and dimensioning of the SPAD array of the present disclosure). Further, to obtain a large breakdown voltage (e.g. above 50V), a high-energy detector may resort to the use of sensor arrays with a large pitch (e.g. above 25 μm) and intrinsic doping of the silicon bulk material.

In some embodiments, a diameter of each primary electrode may be between 400 nm and 1 μm. The diameter of each primary electrode may for example be approximately 700 nm. Such a diameter may e.g. promote the concentration of the electric field around the primary electrode in the depletion layer, thereby reinforcing the field peak close to the primary electrode due to geometry rather than doping.

In some embodiments, a doping concentration of the depletion layer may have a magnitude of between $1e15\ cm^{-3}$ and $1e17\ cm^{-3}$.

In some embodiments, a distance between each primary electrode and the at least one neighboring secondary electrode may be below 3 μm. Such a distance may enable a higher degree of depletion of the depletion layer.

In some embodiments, the length of each primary electrode may be approximately the same as a length of the at least one neighboring secondary electrode.

In some embodiments, the secondary electrodes may be arranged such that their cross-sections, in the first plane, form a honeycomb pattern, and wherein, in the first plane, the cross-section of each primary electrode is arranged within a hexagon formed by six neighboring secondary electrodes.

In some embodiments, the at least one neighboring secondary electrode may have a cross-section, in the first plane, shaped like an annulus surrounding the cross-section of each primary electrode. Phrased differently, (the cross-section of) each primary electrode may be surrounded by an annulus-shaped (cross-section of a) secondary electrode.

In some embodiments, the first doping type may be an n-type doping, and the second doping type may be a p-type doping.

In some embodiments, a doping concentration of the primary electrodes and a doping concentration of the secondary electrodes may have magnitudes of between $1e18\ cm^{-3}$ and $1e20\ cm^{-3}$.

In some embodiments, the length of each primary electrode may be between 10 μm and 30 μm.

In some embodiments, the secondary electrodes may have cross-sections, in the first plane, equal to the cross-sections of the primary electrodes.

In some embodiments, a doping concentration in the depletion layer may be gradually reduced from that (i.e. the doping concentration) of the semiconductor material of each primary electrode to that (i.e. the doping concentration) of the remaining bulk silicon volume. The gradual reduction may occur over a length of between 50 nm and 200 nm.

In some embodiments, a part of the semiconductor material of each primary electrode closer to the lower field redistribution layer may include a localized implant of the first doping type.

In some embodiments, one or more of the secondary electrodes may neighbor more than one of the primary electrodes. Phrased differently, two or more of the primary electrodes may both have a same secondary electrode as a neighbor.

In some embodiments, the SPAD array may further include a plurality of resistive (poly-silicon) tracks. The tracks may electrically connect the primary electrodes to a common point.

In some embodiments, the SPAD arrays may further include an active readout circuit for each primary electrode. Each primary electrode may be electrically connected to the input of a readout circuit.

In some embodiments, multiple closest-neighboring primary electrodes (e.g. 2 or more) may be electrically connected to a single passive or active readout circuit. The connected SPADs may e.g. effectively behave as a single SPAD with a larger pitch.

The present disclosure relates to all possible combinations of features recited in the claims. Further features of the various embodiments of the present disclosure will be described below using example embodiments.

BRIEF DESCRIPTION OF THE DRAWINGS

Embodiments will be described below with reference to the accompanying drawings.

Figure 1A:
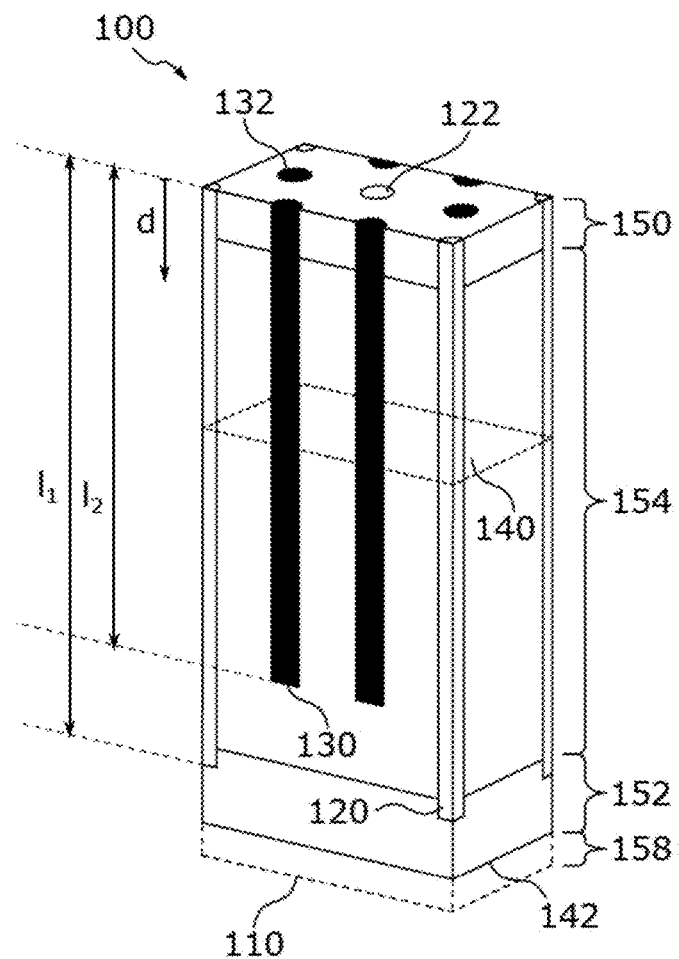
FIG. 1A schematically illustrates a unit cell of an embodiment of a SPAD array, according to example embodiments.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may not necessarily be drawn to scale and may e.g. be exaggerated for illustrative purposes and, thus, are provided to illustrate the general structures of the embodiments.

DETAILED DESCRIPTION

Example embodiments will now be described more fully hereinafter with reference to the accompanying drawings. The drawings show example embodiments, but the invention may, however, be embodied in many different forms and should not be construed as limited to the embodiments set forth herein; rather, these embodiments are provided for thoroughness and completeness, and fully convey the scope of the present disclosure to the skilled person.

With reference to FIGS. 1A to 1F, various embodiments of a SPAD array according to the present disclosure will now be described in more detail.

Figure 1B:
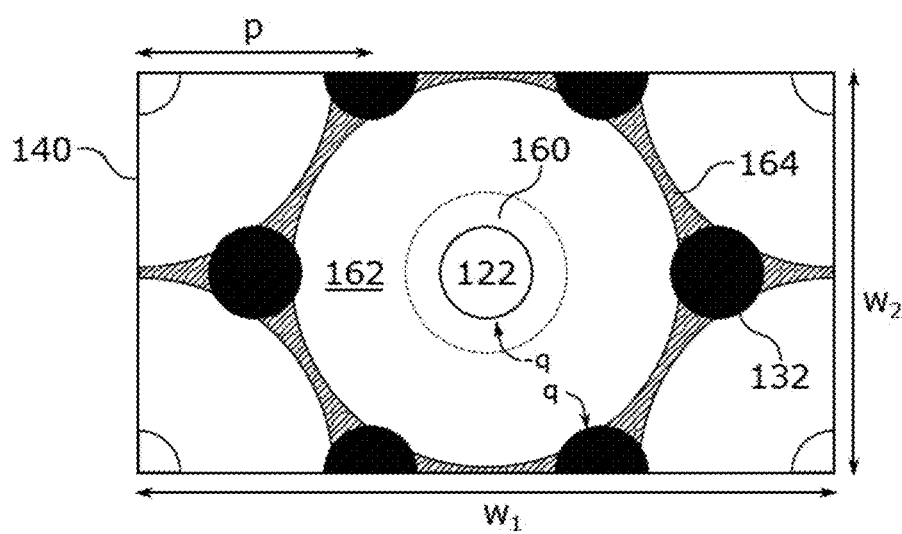
FIG. 1B schematically illustrates a unit cell of an environment of a SPAD array, according to example embodiments.

FIGS. 1A and 1B illustrate schematically a unit cell of a SPAD array 100. The array 100 includes a silicon substrate 110, in which is formed a plurality of primary electrodes 120 and a plurality of secondary electrodes 130. The primary electrodes 120 extend in the substrate 110 in the direction indicated by the arrow d. The secondary electrodes 130 also extend in the direction indicated by the arrow d, and parallel to the primary electrodes 120.

The primary electrodes 120 include a semiconductor material of a first doping type (e.g. an n-type or p-type doping), and the secondary electrodes 130 include a semiconductor material of a second doping type (e.g. a p-type doping or an n-type doping).

As will be described later herein, the primary electrodes 120 have rotationally symmetric cross-sections 122 seen in a (first) plane 140 perpendicular to the direction indicated by the arrow d. In the embodiment of the array 100 illustrated in FIG. 1A, the cross-sections 122 of the primary electrodes are circular. In the array 100, the secondary electrodes 130 also have circular cross-sections 132 in the plane 140. The secondary electrodes 130 are arranged such that, in the plane 140, the cross-section 122 of a primary electrode 120 is surrounded by the cross-sections 132 of six secondary electrodes 130. The secondary electrodes 130 are arranged such that their cross-sections form a honeycomb pattern in the plane 140, and each primary electrode 120 is arranged with its cross-section 122 (symmetrically located) within a hexagon formed by the cross-sections 132 of the surrounding six secondary electrodes 130.

Herein, it is of course envisaged that the array 100 does not extend infinitely in any direction, and that the above configuration of the primary electrodes 120 within a hexagon formed by surrounding secondary electrodes 130 is only valid within the bulk of the array 100 and not e.g. close to an outer edge of the array 100. Phrased differently, when referring herein to the various electrodes being e.g. periodically arranged, it is understood that this applies only to the bulk of the array 100.

The silicon substrate 110 of the array 100 further includes a doped upper field redistribution layer 150, a doped lower field redistribution layer 152, and a doped depletion layer 154 arranged between the upper field redistribution layer 150 and the lower field redistribution layer 152. As can be seen from FIG. 1A, the primary electrodes 120 extend from the upper field redistribution layer 150, through the depletion layer 154 and into the lower field redistribution layer 152. As can also be seen from FIG. 1A, the secondary electrodes 130 only extend from the upper field redistribution layer 150 and partly into the depletion layer 154. The cross-sections 122 of the primary electrodes are approximately uniform in the depletion layer 154.

The primary electrodes 120 may for example be negatively doped, i.e. the first doping type may be an n-type doping. The primary electrodes 120 may then work as cathodes. Likewise, the secondary electrodes 130 may for example be positively doped, i.e. the second doping type may be a p-type doping. The secondary electrodes 130 may then work as anodes. Due to the different charge transport and multiplication properties of electrons and holes, such a selection of the first and second doping types may be beneficial.

The diameter of the rotationally symmetric (e.g. circular) cross-section 122 of the primary electrodes 120 may be small compared to other design dimensions, for example, below 1 μm. This may ensure that, once a reverse potential is applied between the primary electrode 120 and the neighboring secondary electrode(s), the resulting electric field tends to crowd around the primary electrode 120 (as derived from Coulomb's law). Phrased differently, the resulting electric field may be peaked at or close to the primary electrode 120 due to a geometric effect rather than doping. Doping may still be used as a tool to enhance or degrade the electric field peak in the various layers 150, 152 and 154. The rotationally symmetric cross-section 122 may further make the resulting electric field radially uniform over at least a majority of the length $l_1$ of the primary electrode 120.

Herein, the application of a reverse potential (or sufficiently high reverse potential) refers to the presence of a larger voltage on the n-type doped electrodes (i.e. cathodes) compared to the voltage on the p-type doped electrodes (i.e. anodes). Moreover, the voltage is equal or larger to the breakdown voltage of an individual SPAD in the array. For example, the SPAD array device may be operated e.g. between 1 V to 5 V above the breakdown voltage. The breakdown voltage may, for example, range between 15 V and 40 V depending on implementation. In some embodiments, a breakdown voltage may, for example, be 30 V.

The various electrodes 120 and 130 may be formed directly in the silicon substrate 110. It is also envisaged that all or some of the electrodes 120 and/or 130 may be formed as e.g. metal rods inserted into or formed in the substrate 110. In case of the latter, a semiconductor material (layer) may surround each such rod. When referring to such an electrode as having a particular doping type, it is then the surrounding semiconductor material which is referred to as being doped with a singular doping type.

A doping level within the depletion layer 154 may be high enough to further enhance the field around the primary electrode 120 (e.g. around the cathode), and especially in the region 160 wherein the electric field is peaked such that impact ionization can occur when a reverse potential is applied. The region 160 may be referred to as a multiplication region. It is further envisaged that the multiplication region 160 may extend over the entire length $l_1$ of the primary electrode 120, except for at the top and bottom regions of the primary electrode 120 located within the upper field redistribution layer 150 and the lower field redistribution layer 152, respectively. It is envisaged that the doping concentration within the depletion layer 154 may have a magnitude of between $1e15$ cm$^{-3}$ and $1e17$ cm$^{-3}$, and that such a doping level may prohibit the depletion region (i.e. the region 162) from extending very far from the primary electrode 120. Consequently, it is also envisaged that the pitch p is sufficiently small to still allow for full, or at least approximately full or high depletion between the primary electrode 120 and the nearest neighboring secondary electrodes 130.

As an example, the separation (pitch) p between a primary electrode 120 and its neighboring secondary electrodes 130 (within the plane 140) may for example be equal to or less than approximately 3 μm, such as for example approximately 2 μm. A diameter (of the cross-sections in the plane 140) of the primary electrodes 120 and the secondary electrodes 130 may for example be between 400 nm and 1 μm, such as for example approximately 700 nm. If arranging the electrodes 120 and 130 as illustrated in FIGS. 1A and 1B, a first width $w_1$ of the unit cell may for example be approximately 6 μm. A second width $w_2$ of the unit cell may for example be approximately 3.5 μm (or 2 μm times the square-root of three).

Herein, it is envisaged that values such as X+/−10%, or X+/−5%, are to be considered as being "approximately X." It is of course also envisaged that other dimensions, not falling within the above given values, may be used, if the functionality (as will be described later herein) of the array 100 is maintained.

It is further envisaged that the doping in the depletion layer 154 forms a substantial contrast with the doping in the upper and lower field redistribution layers 150 and 152, respectively. The doping in these layers 150 and 152 may for example be of a doping type and concentration different from those of the depletion layer 154. The electric field peak is thereby locally reduced around the primary electrode 120 within these layers 150 and 152. However, the doping is also such that the primary electrodes (cathodes) 120 are electrically isolated from each other through potential barriers 164 formed between (and e.g. below) the secondary electrodes 130 when a reverse potential is applied, as illustrated in FIG. 1B.

It is envisaged that in some embodiments, such as in the SPAD array illustrated in and described with reference to FIG. 1A, at least the lower field redistribution layer 152 may have a thickness approximately equal to or larger than a distance between a primary electrode 120 and its nearest neighboring secondary electrode(s) 130 (i.e. a thickness approximately equal to the pitch p).

Further, as illustrated in FIG. 1A, a further doped layer 158 may be provided in the substrate 110 below the lower field redistribution layer 152. This further layer 158 may for example be of the second doping type, and be highly doped (with a doping concentration magnitude equal to or larger than 5e18 cm$^{-3}$). A thickness of this further, highly doped layer 158 may be for example anywhere between 0 µm to 750 µm. The highly doped layer may be not depleted, and an external potential may be applied to it. In some embodiments, for example, the thickness may be 0 µm (i.e. the further layer 158 is non-existing). It may also, in such a situation, be envisaged that such a further layer 158 is created during manufacturing of the SPAD array, but removed (e.g. fully etched away) at a later stage before finalizing the array. It is further envisaged that, if such a further layer 158 is present, a length $l_1$ of the primary electrodes 120 are such that the primary electrodes 120 have a relatively large distance from the further layer 158, unless the further layer 158 is to be removed afterwards. Phrased differently, it is envisaged that the primary electrodes 120 never extends into the further layer 158 when it exists. If the further layer 158 is non-existing, primary and/or secondary electrodes 120 and 130 may extend to the bottom surface 142 of the lower field redistribution layer 152. If the further layer 158 is non-existing and no electrodes extend to the bottom surface 142 of the lower field redistribution layer 152, an external potential may be applied to this surface 142.

The length $l_1$ of the primary electrodes 120 and a length $l_2$ of the secondary electrodes 130 may for example be between 10 µm and 30 µm. As an example, the length $l_1$ may be approximately 12 µm, and the length $l_2$ may be approximately 10 µm. In some embodiments, such as the SPAD array 100 illustrated in FIGS. 1A and 1B, making the primary electrodes 120 deeper than the secondary electrodes 130 (i.e. such that $l_1 > l_2$) may prevent larger field peaks to exist near the bottom of the primary electrodes 120. The primary electrodes 120 may for example extend into a region with a different doping concentration and/or type compared to the secondary electrodes 130. If the primary electrodes 120 and secondary electrodes 130 have a different length, the thickness and doping concentration of the lower field redistribution layer 152 may be adapted such that the field is properly redistributed. Likewise, the length $l_2$ of the secondary electrodes 130 should not be too short, i.e. such that it becomes difficult to electrically isolate the primary electrodes 120 by the potential barriers provided below and between the secondary electrodes 130.

A doping concentration of the primary electrodes 120 and the secondary electrodes 130 may for example have magnitudes of between 1e18 cm$^{-3}$ and 1e20 cm$^{-3}$. The doping concentration may be gradually reduced from that of the semiconducting material of each electrode to that of the remaining bulk silicon volume. The reduction may occur over a length-scale between 50 nm and 200 nm.

Figure 1C:
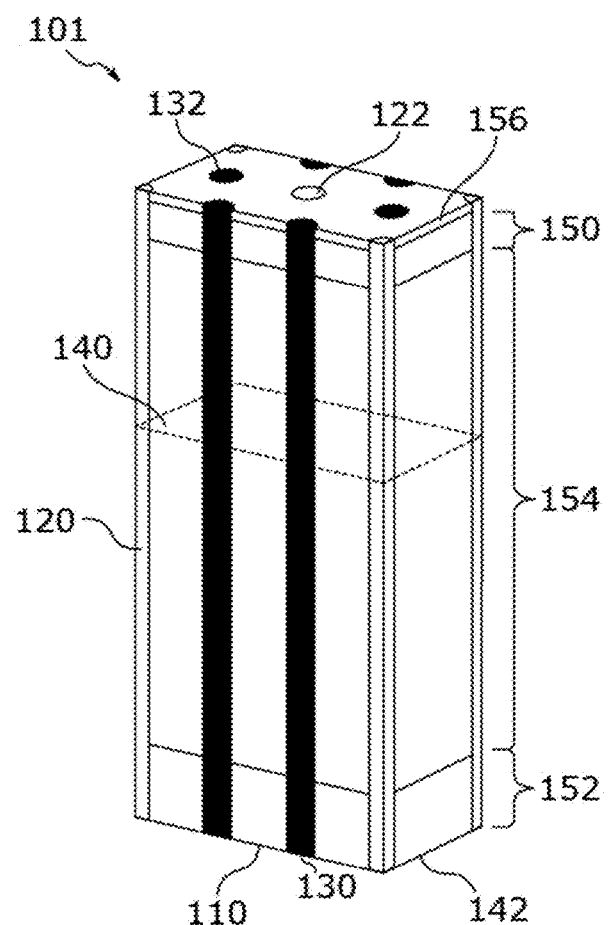
FIG. 1C schematically illustrates a unit cell of a SPAD array, according to example embodiments.

FIG. 1C illustrates schematically another embodiment of a SPAD array 101. The unit cell of the array 101 is similar to the array 100 described above with reference to FIGS. 1A and 1B, except that the primary electrodes 120 and the secondary electrodes 130 have equal or at least approximately equal lengths (i.e. $l_1 \approx l_2$), and extend to the bottom surface 142 of the lower field redistribution layer 152. Additionally, the unit cell of the array 101 includes an oxide layer 156 arranged on top of the upper field redistribution layer 150. Such an oxide layer 156 may of course also be provided in an embodiment such as that illustrated in FIGS. 1A and 1B.

Figure 1D:
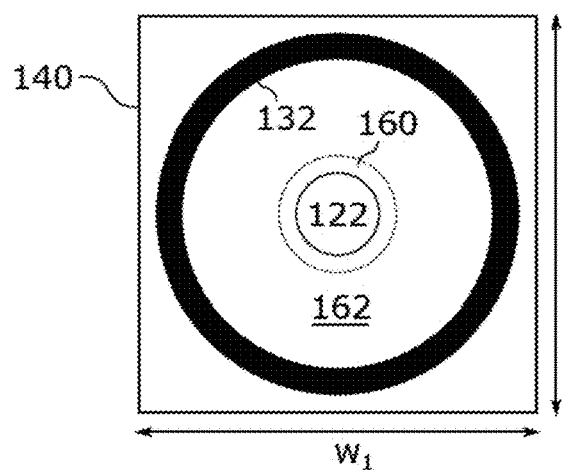
FIG. 1D schematically illustrates a unit cell of a SPAD array, according to example embodiments.
Figure 1E:
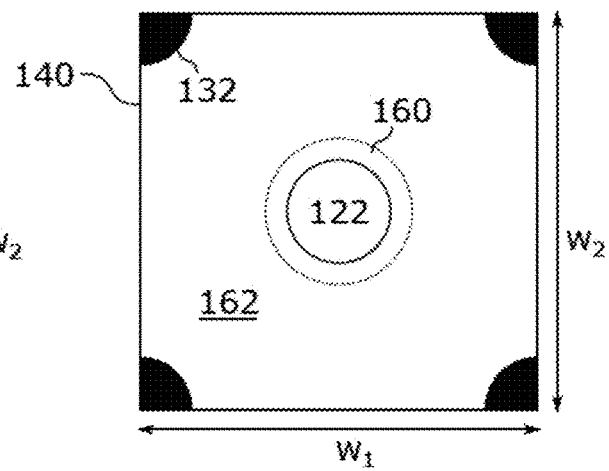
FIG. 1E schematically illustrates a unit cell of a SPAD array, according to example embodiments.

FIGS. 1D and 1E illustrate unit cells of additional embodiments of SPAD arrays according to the present disclosure. As illustrated in FIG. 1D, it is envisaged that the cross-sections of the various electrodes in the first plane 140 may be such that a primary electrode 120 is arranged within a cylindrically shaped, neighboring secondary electrode 130. The cross-section 122 of the primary electrode 120 is circular within the plane 140, and the cross-section 132 of the secondary electrode 130 forms an annulus which encloses the cross-section 122 of the primary electrode 120. The cross-section 122 of the primary electrode 120 is here also circularly shaped, and arranged symmetrically at the center of the annulus formed by the cross-section 132. In accordance with the geometry and doping constraints described in the present disclosure, the diameter of the cross-section 122 of the primary electrode may be small (e.g. below 1 µm), the inner radius of the annulus 132 may be small (e.g. below 3 µm) and the doping concentration between the electrodes may be selected such that the depletion layer is depleted and the electric field is highly peaked around the primary electrode (within the multiplication region 160) in the depletion layer when a reverse potential is applied. It may for example be envisaged that the unit cell shown in FIG. 1D is square, such that the first width $w_1$ equals the second width $w_2$. Other configurations are also possible, e.g. such that the unit cell is rectangular with $w_1 \neq w_2$.

As illustrated in FIG. 1E, it is envisaged that the cross-sections of the various electrodes in the first plane 140 may alternatively be arranged in e.g. rectangular patterns. For example, as illustrated in FIG. 1E, each primary electrode 120 may be surrounded by four (nearest) neighboring secondary electrodes 130, such that their cross-sections 122 and 132 together form e.g. a triangular lattice, square, or rectangular lattice. For example, the primary electrodes 120 may be arranged such that, in the first plane 140, their cross-sections 122 form a rectangular lattice. The secondary electrodes 130 may be arranged such that, in the first plane 140, their cross-sections 132 also form a rectangular lattice, but shifted from that of the primary electrodes 120. The sizes and dimensions of the electrodes may be approximately identical to those of the embodiment illustrated in and described with reference to FIG. 1A., i.e. the primary electrode may be small (e.g. below 1 µm), a distance between a primary electrode and a nearest neighboring secondary electrodes may be small (e.g. below 3 µm), and the doping concentration between the electrodes may be selected such that the depletion layer is depleted and the electric field is highly peaked around the primary electrode (within the multiplication region 160) in the depletion layer when a reverse potential is applied. It is envisaged that in the unit cell shown in FIG. 1E, the widths $w_1$ and $w_2$ may be equal (e.g. for square lattices), or different (e.g. for rectangular lattices).

Figure 1F:
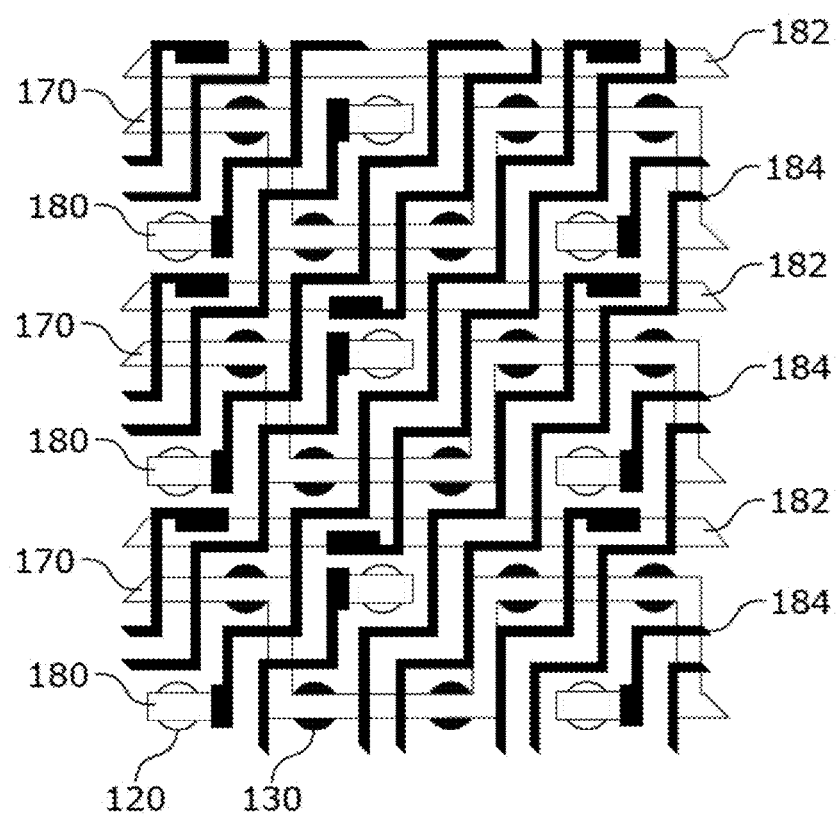
FIG. 1F schematically illustrates a connection network of a SPAD array, according to example embodiments.

FIG. 1F illustrates an embodiment of a SPAR array, wherein on top of an oxide layer, such as the layer 156 described with reference to FIG. 1C, is provided a connection network in form of a plurality of tracks (e.g. 184), to connect the various electrodes together. In this and other embodiments, the oxide layer 156 may for example be several hundreds of nanometers thick. For example, the oxide layer 156 may be approximately 400 nm, although other thicknesses are also possible.

For example, metal strips/lines/tracks/paths 170 may be provided to connect secondary electrodes (indicated by filled circles) 130 together. Similarly, metal pads 180 may be provided above primary electrodes (indicated by empty circles) 120, and the pads 180 may in turn be electrically connected together by a plurality of tracks 184. Each pad 180 may be electrically connected to the underlying primary electrode 120. The tracks 184 may for example be (highly-resistive) poly-silicon tracks. The tracks 184, as visible in FIG. 1F, may form a meandering pattern. The tracks may further be connected to metal strips/lines/tracks/paths 182, which may in turn may be connected together such that the primary electrodes 120 are all electrically connected to a common point/potential. Such connections formed by the various elements 170, 180, 182 and 184 may provide an optimized use of available space.

The tracks 184 may for example also function as passive quenching resistors. Instead of, or in addition to, quenching resistors, active circuitry (i.e. based on transistors) could be connected to the primary electrodes. The active circuitry may be monolithically integrated on the same die as the sensor array, and/or integrated on a secondary electrically connected die. Some primary electrodes may also be connected together (and share a same active circuitry).

In summary, the details given above for the various embodiments of a SPAD array according to the present disclosure allows for the following conditions to be fulfilled when a sufficiently high reverse bias is applied between the primary and secondary electrodes: the resulting electric field is radially uniform close to the primary electrodes in the cross-section of the electrodes; the electric field cross-section is uniform over a large (or majority) portion of the primary electrodes; the electric field may be reproducible between different detectors (i.e. between multiple unit cells) in the SPAD array; the electric field is sufficiently high at low biasing conditions while still enabling the depletion of the remaining part of the device, and the electric field in different parts of the device is manageable by locally adapting the doping type and concentration such that parasitic effects may be suppressed. Also, the electric field close to a primary electrode is (highly) peaked over the majority of the length of the primary electrode, which may allow for uniform charge multiplication of carriers originating from anywhere within the device.

The person skilled in the art realizes that the present disclosure is not limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claims, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A single-photon avalanche diode (SPAD) array comprising:
a silicon substrate;
a plurality of primary electrodes, wherein:
each of the plurality of primary electrodes comprises a semiconductor material of a first doping type,
each of the plurality of primary electrodes extends in the silicon substrate in a first direction, and
each of the plurality of primary electrodes has a rotationally symmetric cross-section in a first plane perpendicular to the first direction; and
a plurality of secondary electrodes, wherein:
each of the plurality of secondary electrodes comprises a semiconductor material of a second doping type, and
each of the plurality of secondary electrodes extends parallel to the plurality of primary electrodes in the silicon substrate,
wherein the silicon substrate further comprises:
a doped upper field redistribution layer;
a doped lower field redistribution layer; and
a doped depletion layer arranged between the doped upper field redistribution layer and the doped lower field redistribution layer,
wherein the plurality of primary electrodes extends from the doped upper field redistribution layer, through the doped depletion layer, and into the doped lower field redistribution layer of the silicon substrate,
wherein the plurality of secondary electrodes extends from the doped upper field distribution layer and at least into the doped depletion layer, and
wherein the plurality of primary electrodes and the plurality of secondary electrodes are configured such that:
a cross-section of each primary electrode is surrounded, in the first plane, by one or more cross-sections of at least one neighboring secondary electrode; and
based on doping concentrations of the doped upper field redistribution layer, the doped lower field redistribution layer, and the doped depletion layer, when a sufficiently high reverse potential is applied between each primary electrode and the at least one neighboring secondary electrode:
a resulting electric field near each primary electrode is radially uniform and peaked such that impact ionization can occur close thereto and such that a cross-section of the resulting electric field is uniform throughout a majority of the doped depletion layer;
a remaining bulk silicon volume between each primary electrode and the at least one neighboring secondary electrode is depleted;
the resulting electric field at the doped upper and doped lower field redistribution layers is not peaked such that impact ionization can be locally suppressed; and
the plurality of primary electrodes are electrically isolated due to one or more potential barriers formed by the plurality of secondary electrodes.

2. The SPAD array of claim 1, wherein a diameter of each of the plurality of primary electrodes is between 400 nm and 1 μm.

3. The SPAD array of claim 1, wherein a doping concentration of the doped depletion layer has a magnitude of between $1e15$ cm$^{-3}$ and $1e17$ cm$^{-3}$.

4. The SPAD array of claim 1, wherein a distance between each of the plurality of primary electrodes and each of the at least one neighboring secondary electrodes is less than 3 μm.

5. The SPAD array of claim 1, wherein a length of each of the plurality of primary electrodes is approximately the same as a length of each of the at least one neighboring secondary electrodes.

6. The SPAD array of claim 1,
wherein the plurality of secondary electrodes are arranged such that their cross-sections in the first plane form a honeycomb pattern, and
wherein, in the first plane, the cross-section of each of the plurality of primary electrodes is arranged within a hexagon formed by six neighboring secondary electrodes.

7. The SPAD array of claim 1, wherein the at least one neighboring secondary electrode has an annular cross-section in the first plane surrounding a cross-section of a primary electrode of the plurality of primary electrodes.

8. The SPAD array of claim 1, wherein the first doping type is an n-type doping and the second doping type is a p-type doping.

9. The SPAD array of claim 1, wherein a doping concentration of the plurality of primary electrodes and a doping concentration of the plurality of secondary electrodes have magnitudes between $1e18$ $cm^{-3}$ and $1e20$ $cm^{-3}$.

10. The SPAD array of claim 1, wherein a length of each of the plurality of primary electrodes is between 10 μm and 30 μm.

11. The SPAD array of claim 1, wherein the plurality of secondary electrodes have cross-sections, in the first plane, equal to the cross-sections of the plurality of primary electrodes.

12. The SPAD array of claim 1, wherein a doping concentration in the doped depletion layer is gradually reduced from that of the semiconductor material of each of the plurality of primary electrodes to that of the remaining bulk silicon volume over a length of between 50 nm and 200 nm.

13. The SPAD array of claim 1, wherein a part of the semiconductor material of each of the plurality of primary electrodes that is closer to the lower field redistribution layer comprises a localized implant of the first doping type.

14. The SPAD array of claim 1, wherein one or more of the plurality of secondary electrodes neighbors more than one of the plurality of primary electrodes.

15. The SPAD array of claim 1, further comprising a plurality of resistive poly-silicon tracks electrically connecting the plurality of primary electrodes to a common point.

* * * * *